United States Patent [19]

Ragard et al.

[11] 4,151,945

[45] May 1, 1979

[54] AUTOMATED HYBRID CIRCUIT BOARD ASSEMBLY APPARATUS

[75] Inventors: Phillip A. Ragard; Roy M. Whiting, both of Binghamton; Michael D. Snyder, Chenango Bridge, all of N.Y.

[73] Assignee: Universal Instruments Corporation, Binghamton, N.Y.

[21] Appl. No.: 858,543

[22] Filed: Dec. 8, 1977

[51] Int. Cl.² .................... B23K 37/04; H01L 21/60
[52] U.S. Cl. .................... 228/6 A; 29/740; 228/7; 228/47
[58] Field of Search .............. 228/6 A, 180 A, 49 R, 228/7, 102, 47; 29/740, 741

[56] References Cited

U.S. PATENT DOCUMENTS

| 3,337,941 | 8/1967 | Drop | 228/6 A X |
|---|---|---|---|
| 3,361,891 | 1/1968 | Whitefield | 228/6 A X |
| 3,395,845 | 8/1968 | Best et al. | 228/47 X |
| 3,465,408 | 9/1969 | Clark et al. | 228/6 A X |
| 3,523,352 | 8/1970 | Hayunga | 29/740 |
| 3,611,561 | 10/1971 | Dosier | 228/6 A X |
| 3,657,790 | 4/1972 | Larrison | 29/592 X |
| 3,958,740 | 5/1976 | Dixon | 228/6 A X |

Primary Examiner—C. W. Lanham
Assistant Examiner—K. J. Ramsey
Attorney, Agent, or Firm—Fidelman, Wolffe & Waldron

[57] ABSTRACT

An apparatus for placement of electronic components on a fluxed hybrid circuit substrate. In accordance with an automated program, the apparatus at a single work station places with high precision a plurality of chips of various types and physical and electrical sizes on a single substrate. Components are successively placed by a pair of hollow pick and placement spindles operating alternately and having motion in the X-Y planes. Precise location of stored chips is not required; the apparatus orients and centers each chip after selection and prior to placement.

19 Claims, 23 Drawing Figures

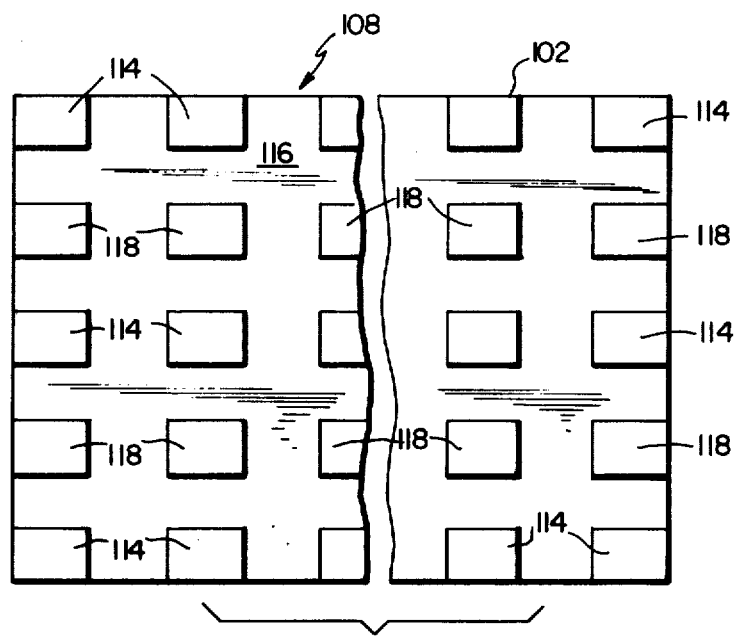
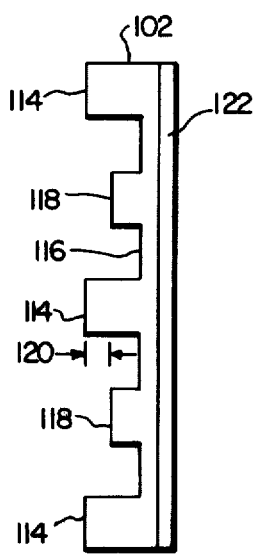
FIG. 5a  FIG. 5b
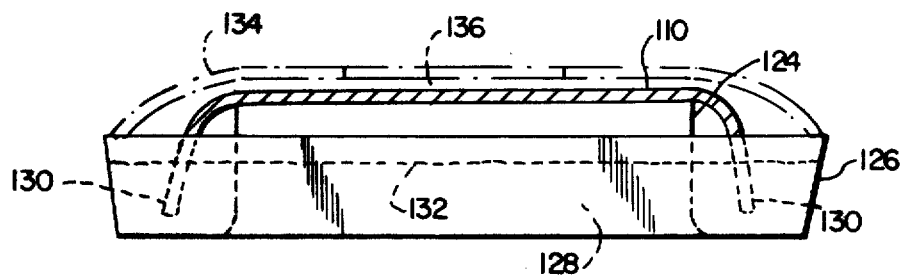
FIG. 6
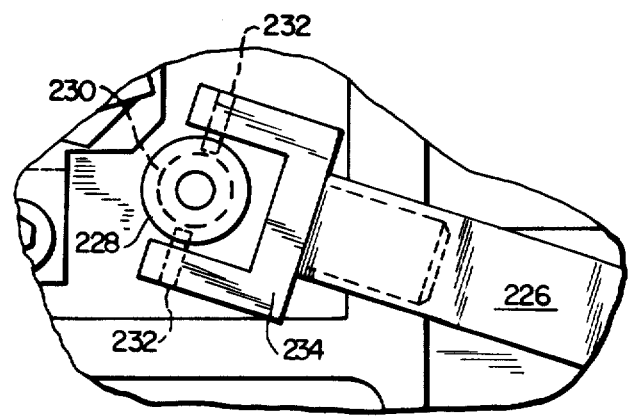
FIG. 10

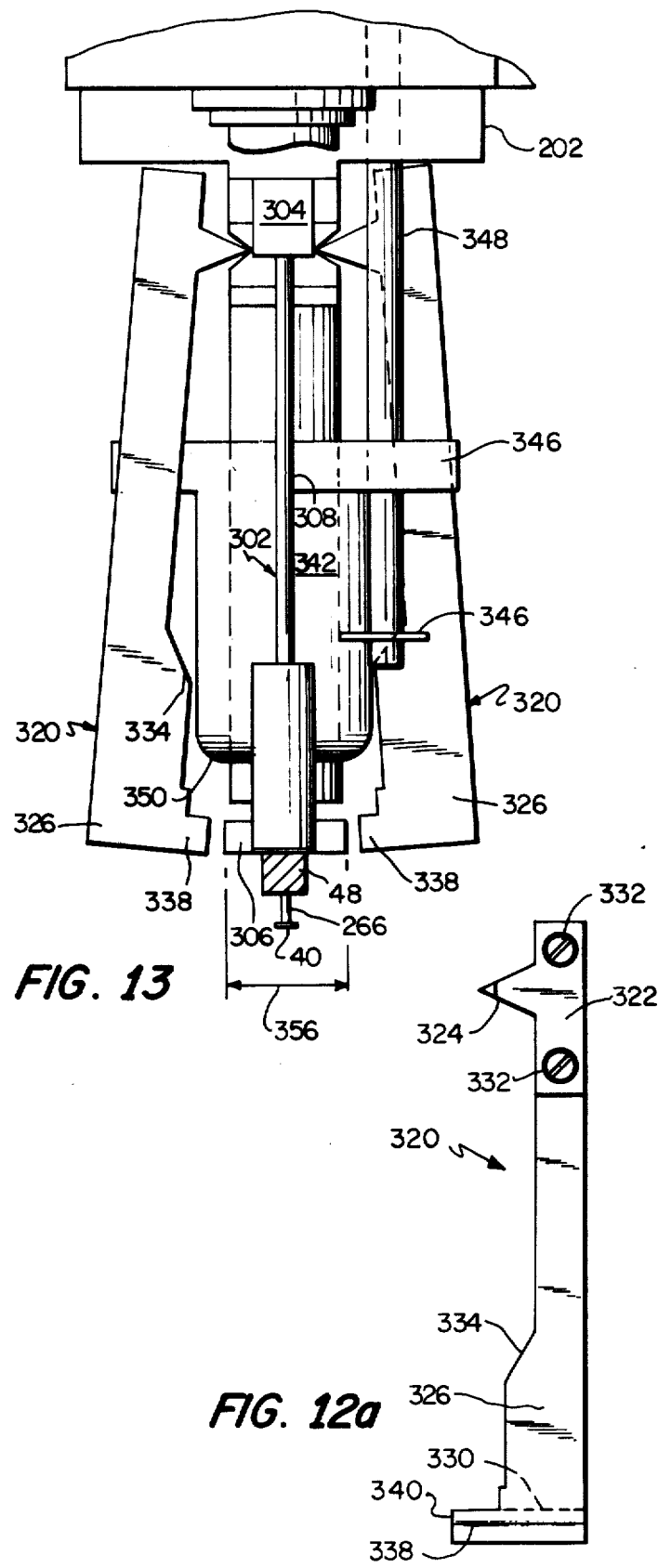
FIG. 13
FIG. 12a
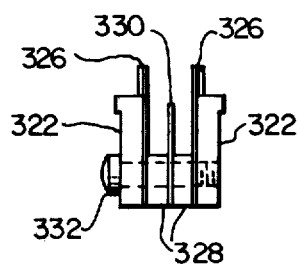
FIG. 12c
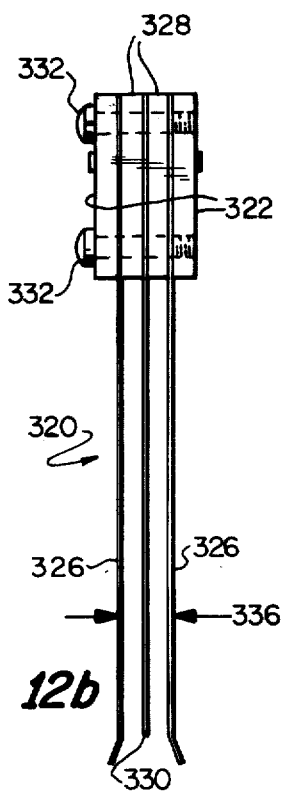
FIG. 12b

AUTOMATED HYBRID CIRCUIT BOARD ASSEMBLY APPARATUS

BACKGROUND OF THE INVENTION

The present invention relates to apparatus for the precision placement of electronic components on an hybrid circuit substrate and, more particularly, to the placement of small articles such as semiconductor chips, capacitor chips and integrated circuit chips, having solder bumps on their lower surfaces and generally known as flip-chips, on a ceramic substrate which has been preprinted with a thick film conductor pattern.

As the name suggests, hybrid circuits are a combination of discrete and integrated circuit techniques. As in integrated circuits, conductors, resistors and conductive lands are printed on a ceramic substrate. In thick film technology, the printed elements are generally several mils thick. Then discrete chips are precisely positioned over the conductive lands and subsequently bonded in position in a manner to complete the electrical circuit. The printed conductor lands provide a pattern which precisely matches to the solder bumps on the bottom surface of the flip chip and these bumps connect to the circuit elements within the chip. The bonded chips and substrate, with an exposed lead frame, are frequently encapsulated in toto in a potting compound for protection against physical and environmental damage. Use of unencapsulated chips on the circuit board allows for the manufacture of physically smaller circuits than those where discrete components which have already been encapsulated have their leads inserted into circuit boards fitted with receiving connectors or into predrilled holes wherein the leads are subsequently cut and clinched. A primary advantage of chips is their small size, some being nearly microscopic. Chips in the order of 0.030 by 0.030 inches square and 0.010 thick and solder bumps and conductor lands in the order of 0.005 inches in height and width, and spaced apart by similar distances, are not uncommon. Nevertheless, for the hybrid circuit technique to be successful, the small chips must be positioned and oriented such that when placed on the substrate, all bumps and lands are properly connected without error. This requires a high degree of precision in positioning which was achieved in early development of these techniques by human operators using microscopes and tweezers.

The need for automatic, rapid, precise, repeatable and low cost means to position and bond chips on substrates was apparent if the burgeoning requirements of mass production in the electronics industry were to be met. Generally speaking, in the apparatuses which have been developed in the past, the chip or other small component, e.g., beam leaded components, are picked up and placed by a hollow probe device which is connected to a vacuum source. When the probe touches the upper flat surface of the chip, the vacuum within the probe holds the chip against the probe end. The chip is then raised, translated to the substrate, and lowered onto the substrate. Permanent bonding of chip to substrate is accomplished in some systems while the probe continues to hold the chip. In other systems, the conductive lands are pretreated with some form of tacky adhesive, e.g., solering flux. The probe gently presses the solder bumps on the lower chip surface into the tacky adhesive so that electrical contact is made with the conductive lands. Then the vacuum within the probe is released and the chip remains adhered to the substrate as the probe is withdrawn. A positive gas pressure within the probe is sometimes used to separate the chip from the probe. U.S. Pat. Nos. 3,453,714; 3,337,941; 3,657,790 are among the many which disclose a vacuum probe. U.S. Pat. No. 3,887,998 discloses a magnetic probe for holding chips.

The means to achieve precision placement of chips on substrates varies considerably through the prior art; but in virtually every case, the design approach results in a system which is extremely limited in flexibility. In those designs where a degree of flexibility is achieved, it is achieved at the expense of complexity, or mere multiplication, of work stations in the assembly flow path.

Broadly speaking, the prior art designs fall generally into two categories. In the first category, the substrate and the chip are both separately, fixedly and precisely oriented and located. A transfer mechanism, usually utilizing a vacuum probe as described above, travels an invariable, repetitive path to pick up the chip and place it at one selected position on the substrate. Then, a new substrate and new chip are fed into their respective positions and the operation repeats.

In the second category, the chips start out with a degree of disorientation, for example, at random in a vibratory feeder bowl. The feeder bowl, in the known manner, operates to bring each chip in turn to a precise position. From that point, the design is similar to the first category; although additional steps to angularly orient the chip may be required intermediate the feeder bowl and the precisely located substrate.

U.S. Pat. No. 3,337,941 discloses a complex apparatus which performs a plurality of steps to precisely orient a randomly oriented chip component before placing it upon a precisely located substrate. However, all such devices (in both categories) during a given operating run, can only place one chip at one specific location on each substrate as the substrates move along a synchronized conveyor. And each substrate is identical. Thus, it appears that another complete and similar arraratus would be required to place a second and different chip upon that same substrate and so forth. Or the apparatus could be set up again to handle the same substrates for a second pass after new chips were supplied and after the substrates were repositioned on the conveyor so that a later chip is not placed upon the earlier chip. All of this makes for an inflexible system albeit necessitated by the need to properly orient components before placements.

U.S. Pat. No. 3,909,933, a combination of the first and second categories, discloses an apparatus having a higher degree of flexibility in that it places a plurality of diverse component chips onto a substrate, each in a precise position. A tray of precisely positioned chips rests upon a table movable in the X-Y plane. The substrate rests upon another table movable in the X-Y plane. A pick up head translates in an invariable path along an X axis between the chip tray and the substrate. At the tray the head descends to pick up whichever selected component lies directly below; after translation to the substrate the pick-up head descends to deposit the selected chip on the substrate for bonding. In accordance with a numeric control system, the tray is automatically moved to the X-Y coordinates which place the selected chip component precisely at the location where the head will descend for a component pickup. The same control system locates the substrate by X-Y coordinates such that the area for receiving the selected component is precisely beneath the position where the translated head invariably descends. Thus by moving both the tray and the substrate, a prearranged assortment of components in a tray can be placed one at a time onto a single substrate. In U.S. Pat. No. 3,909,933, two individual trays and two pickup heads operate alternately under one control program to place components on the same substrate. In this apparatus, the trays and the substrate must be precisely located and the chips within a tray must be precisely located one in relation to the other, otherwise the head moving along its invariable path will fail to precisely place component on substrate. Telescopes, television cameras, micrometer adjustments, and the like are utilized in an effort to assure accuracy.

The prior art recognizes a further problem, that of orienting and centering a chip component already being carried on the pick up probe just prior to placement on the substrate. Some systems, as described above, rely on precise positioning of a component before pickup and precise location of the substrate, and assume that action of the pickup head will not disturb the known location and orientation of the component during pickup and translation between pickup station and placement station. In U.S. Pat. No. 3,337,941, a network of feeler switches senses the location of the solder balls on the underside of a chip; the chip is then angularly oriented on the vacuum probe to the desired position. This approach is limited in that one switch network can only "recognize" one pattern of solder balls on a chip and only if the chip is already in one of several probable orientations.

Another device for centering a chip on the vacuum probe prior to placement is disclosed in U.S. Pat. No. 3,982,979. Therein, the rectangular component is supported from below on a probe using a slight vacuum. The probe is centered in a four-sided cavity having the form of an inverted truncated pyramid. As the probe is lowered, the component makes contact with the cavity walls and becomes aligned thereto; at the same time, the component is centered on the probe. A substrate is precisely positioned above the cavity, and the probe is raised to position the centered component on the substrate from below.

What is needed is an apparatus for placement of chips, e.g., integrated circuit chips, capacitor chips, on a preprinted circuit board substrate of the thick film construction. In accordance with an automated program, the apparatus should be capable at a single work station to place with a high degree of precision a plurality of different chips of various types and physical and electrical sizes on a substrate as is required to complete the circuit. The apparatus should be capable of performing without mechanical modification to complete a variety of circuit boards in accordance with a plurality of readily modified programs. The apparatus should contain supplies of chips of many diverse types and sizes, always available for selection and placement on the substrate. Precise location of stored chips should not be required; the apparatus should orient and center each chip after selection and prior to placement.

SUMMARY OF THE INVENTION

The apparatus of this invention includes a circular table having fixtures, or nests, incorporated thereon for securing substrates which are manually loaded and held horizontally in the nests. The table is indexed to four positions, and four work stations are provided for performance of simultaneous but different operations on four substrates. At the first station, the substrate is manually loaded into a nest at a precise location. After indexing the table to the second station, the substrate has a flux coating applied to its upper printed surface by a stamping pad. The flux acts as a tack or adhesive for subsequent assembly of components.

At the third work station, after indexing the table, chip components are placed on the substrate and held by the adhesive flux for later soldering. Components are successively placed by a pair of hollow pick and placement spindles operating alternately and having motion in the X-Y and Z planes. The spindles, using a vacuum, pick up components individually from a plurality of precisely fixed input stations, e.g., component trays, racks, feeder bowls, behind the machine and deliver them to varied locations on the nested, fluxed substrate until the component placements have been completed. To assure precision placement of components, the substrate edges and the spindle housing provide X-Y reference points, and pivoted feet and fingers attached to the spindle housing, center the chip on the spindle prior to placement. The chip need not be precisely positioned at the input station for selection. Additionally, the spindle rotates with the component to provide an angular chip orientation as the circuit board layout requires. Computer controlled servo motors drive the spindles through precision lead screws to the X-Y coordinates required to select any desired component from its storage location and place it precisely at any desired location on the substrate.

After indexing to the final work station, the substrate with adhering components is automatically released from the nest, and gently lifted and placed upon a conveyor for transport to a soldering facility. The soldering facility is not part of this invention and is not described further herein.

Accordingly, an object of the present invention is the provision of an apparatus to automatically select any desired chip component from a storage array and place it on a substrate at any desired location.

Another object of the present invention is the provision of an apparatus capable of selecting chip components successively from any of a plurality of component storage trays and placing them successively at various locations on a single substrate in accordance with a program.

A further object of the present invention is the provision of an apparatus which is flexible in operation and can readily operate with a new variety of components, new substrate patterns, and new programs.

Yet another object of the present invention is an apparatus which is precise in placement of components on a substrate.

Still another object of the present invention is provision of an apparatus which is time-saving by providing multiple placement heads operating alternately to select and place components.

A still further object of the present invention is provision of an apparatus which automatically detects malfunctios in selection and retention of components and adjusts performance to remedy or accommodate malfunctions.

Another object of the present invention is to provide an apparatus which allows imprecision in component storage and centers components prior to placement on a substrate.

Still another object of the present invention is to provide X-Y positioning and angular orientation for locating components on a substrate.

A further object of the present invention is an apparatus which provides variable forces for placement of components on the substrate.

Other objects, advantages, and novel features of the present invention will become apparent from the following detailed description of the invention when considered in conjunction with the accompanying drawing in which.

Figure 1:
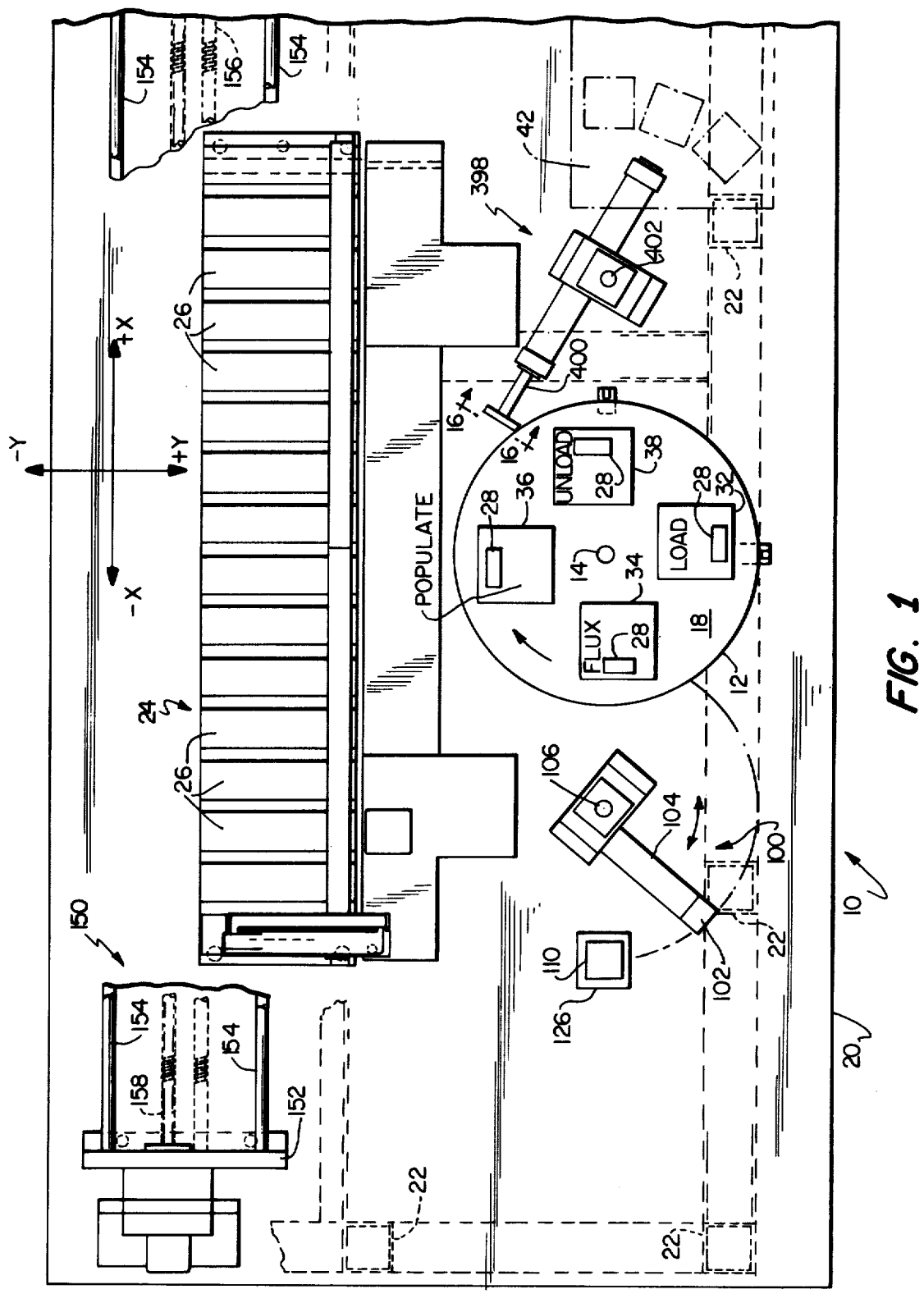
FIG. 1 is a plan view of the apparatus of this invention with parts omitted and partially cut away.

FIGS. 5(a) and (b) are the plan and side elevation views respectively of the stamp pad of FIG. 1.

FIG. 6 is an elevational view at the fluxing station of FIG. 1.

Figure 4:
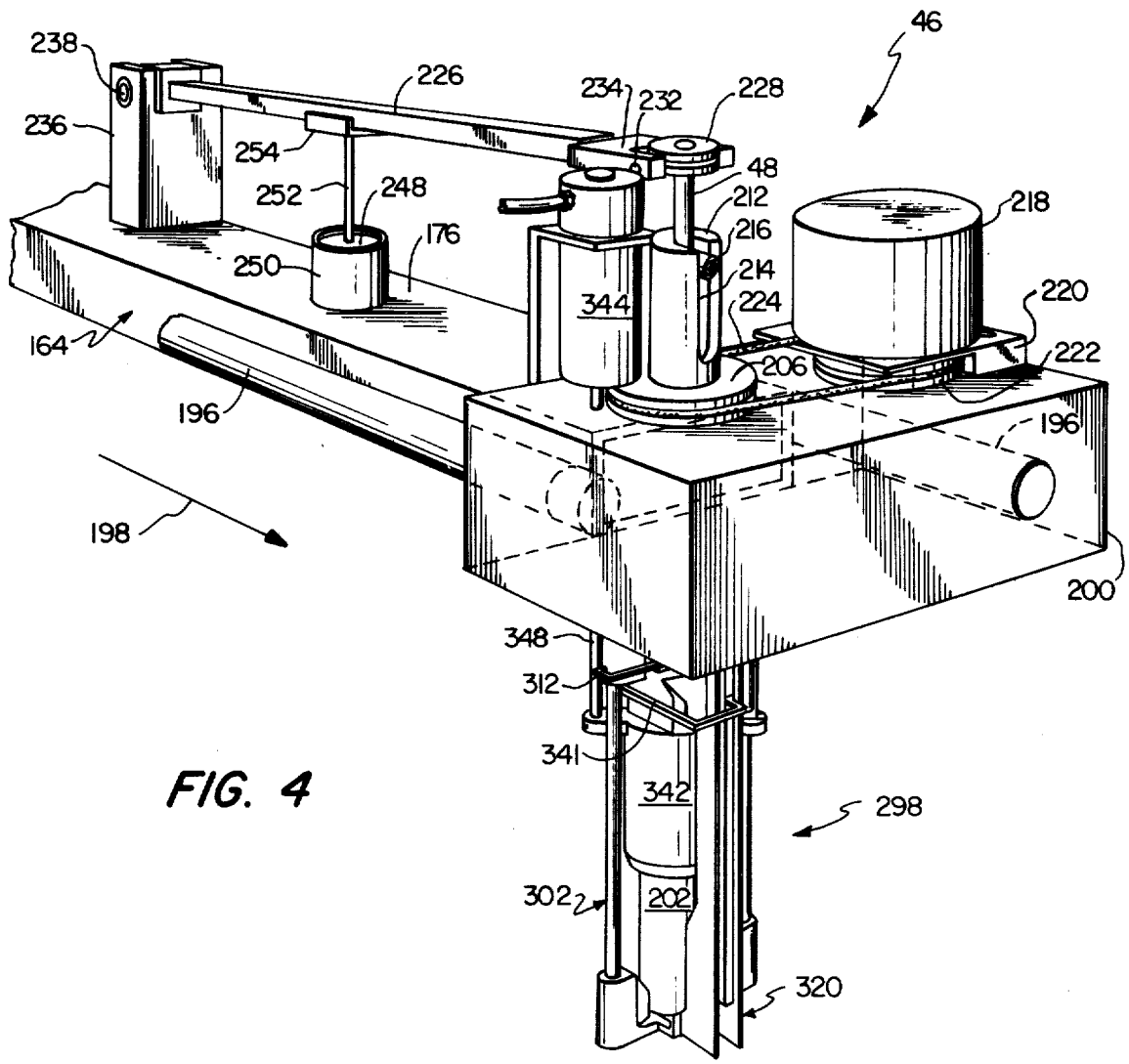
FIG. 4 is a perspective view of the right hand head assembly of FIG. 2.
Figure 7:
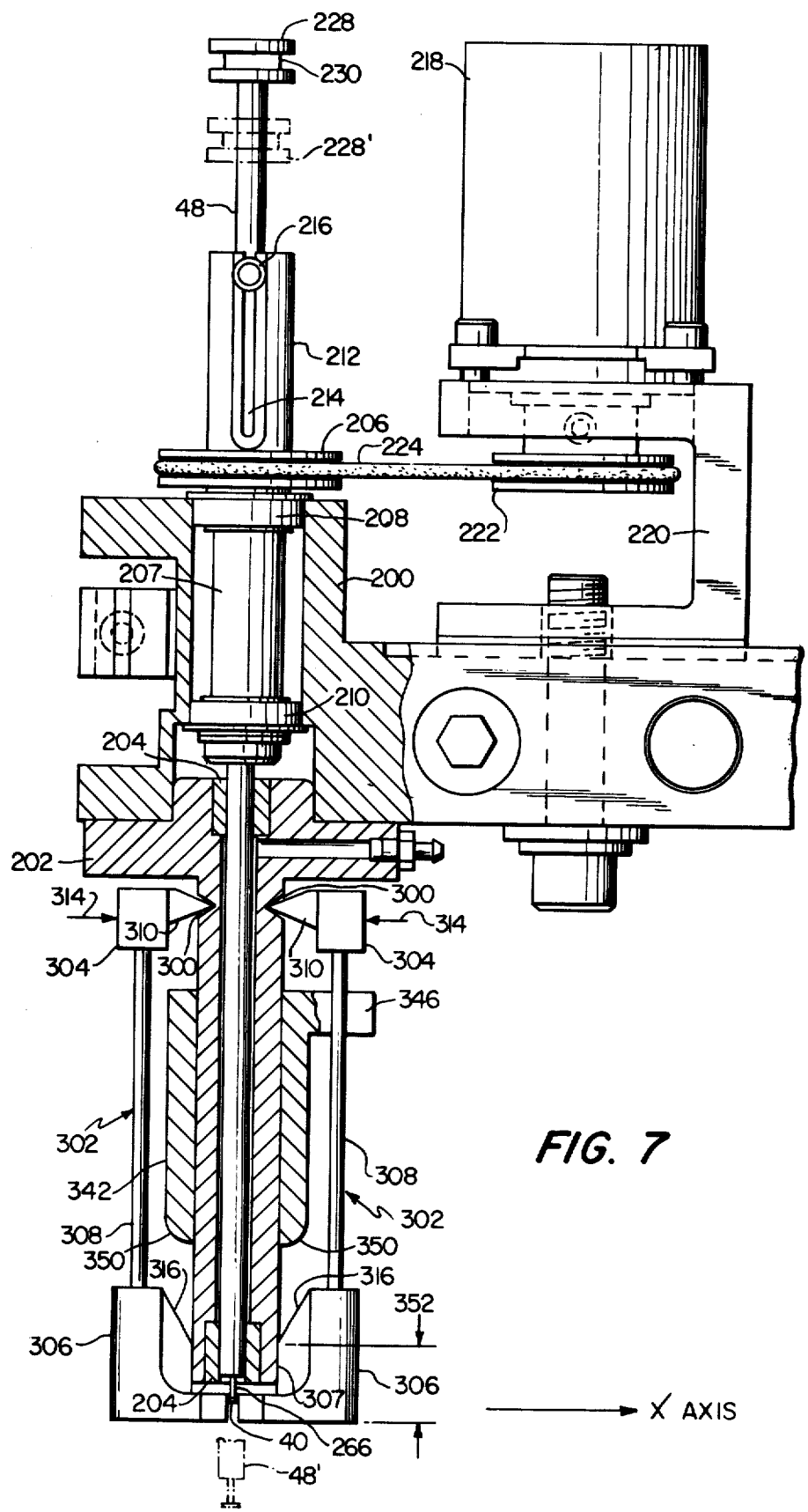

FIG. 7 is a front elevational view, fragmented and partially in section of the head assembly of FIG. 4.

Figure 8:
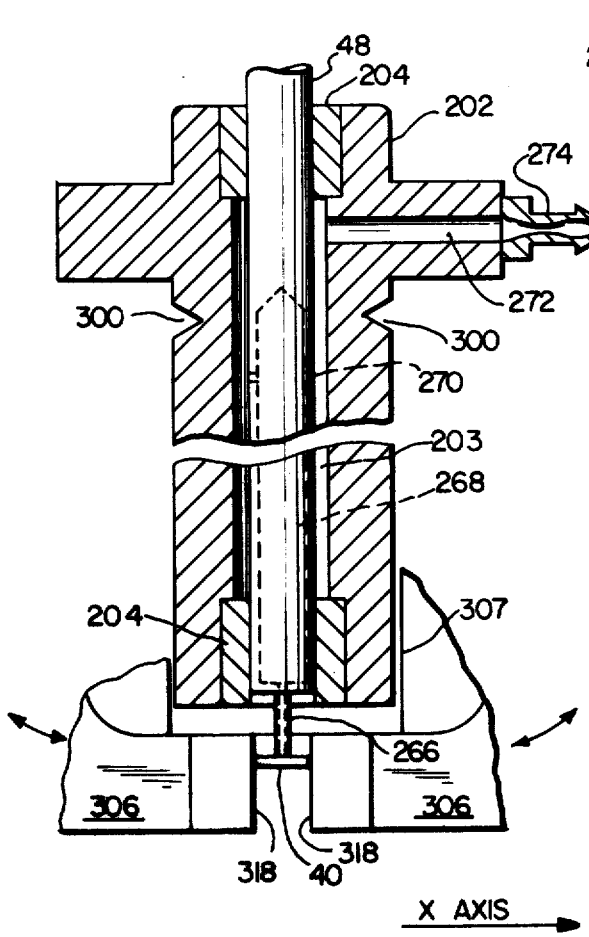

FIG. 8 is an enlarged segment with parts omitted of the spindle mountings of FIG. 7.

Figure 9:
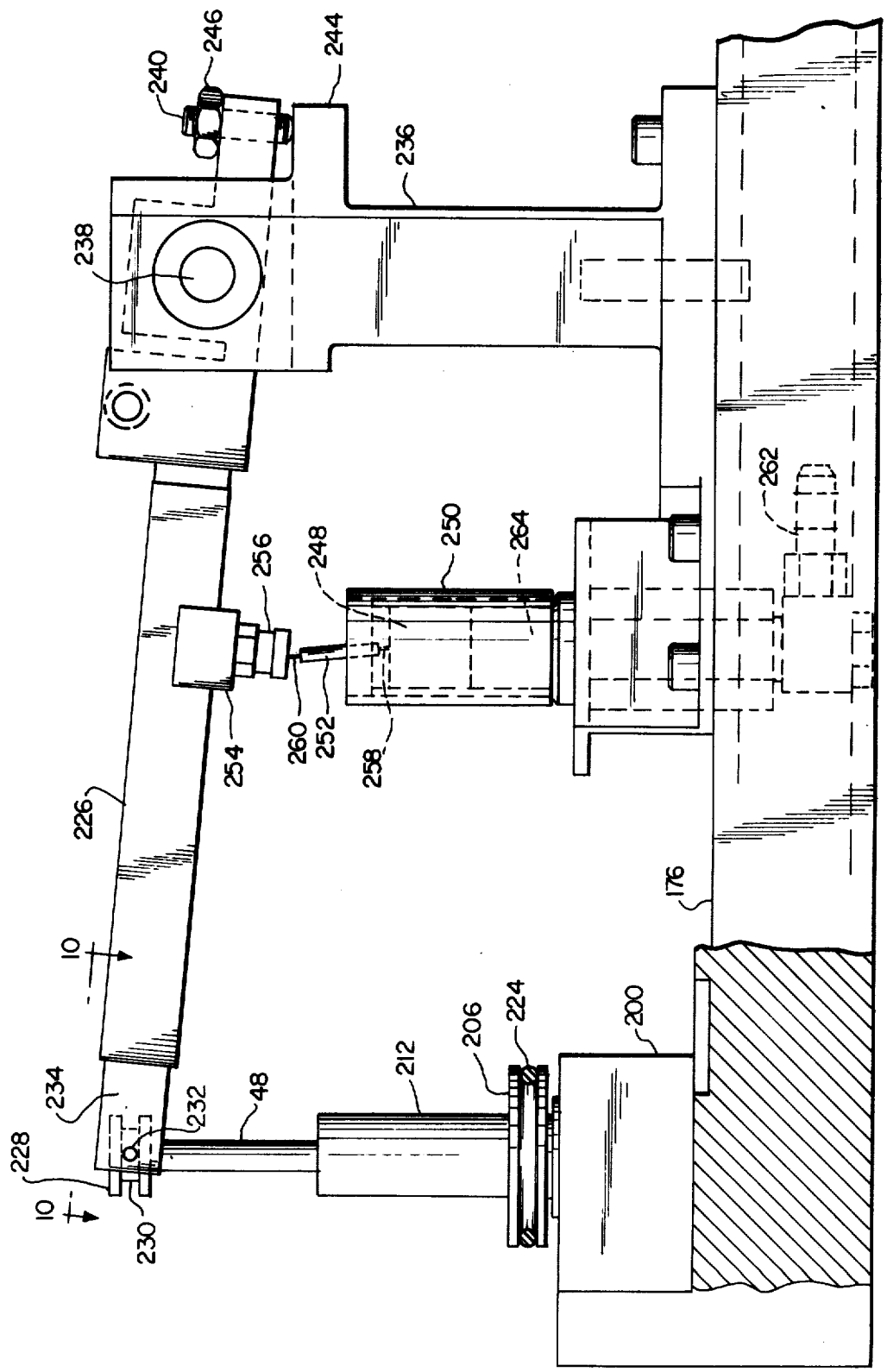

FIG. 9 is a side elevational view of the head assembly of FIG. 7.

FIG. 10 is a fragmented top view taken along the line 10—10 of FIG. 9.

Figure 11:
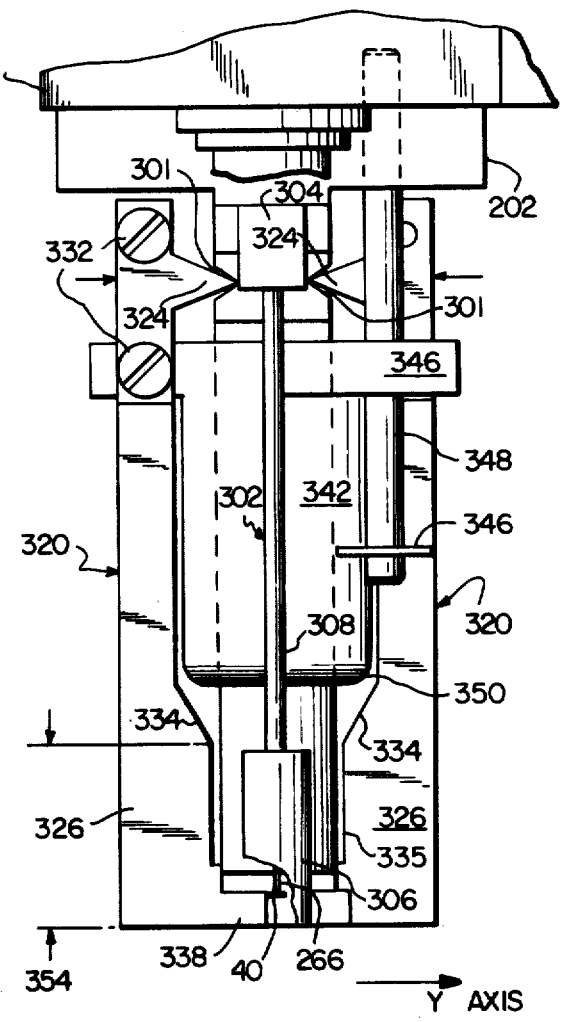

FIG. 11 is a side elevational view, similar to FIG. 7, of the head assembly of FIG. 4.

FIGS. 12(a) (b) (c) are three orthogonal views of the centering device Y-axis locator of FIG. 11.

FIG. 13 is a view similar to FIG. 11 showing the centering device locators pivoted apart and the spindle extended.

Figure 14A:
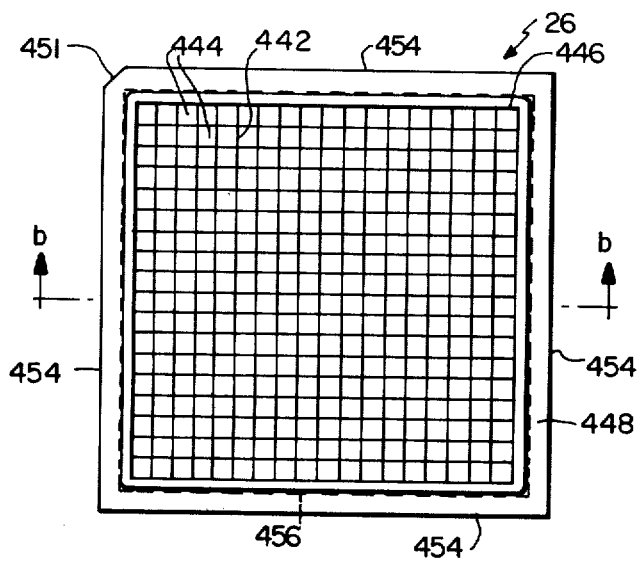

FIG. 14(a) is the top view of a chip component storage tray.

Figure 14B:
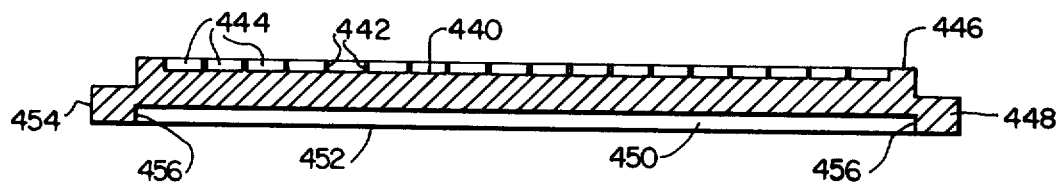

FIG. 14(b) is an elevational view to an enlarged scale in section taken along the line b—b of FIG. 14(a).

Figure 15A:
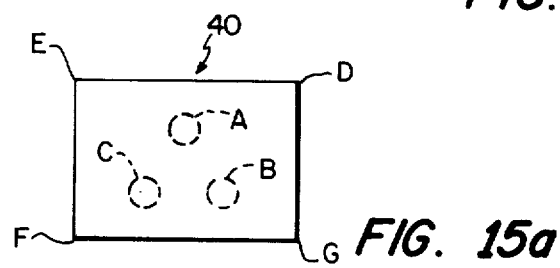

FIGS. 15(a) (b) (c) show to an enlarged scale a component chip in three orientations.

Figure 16:
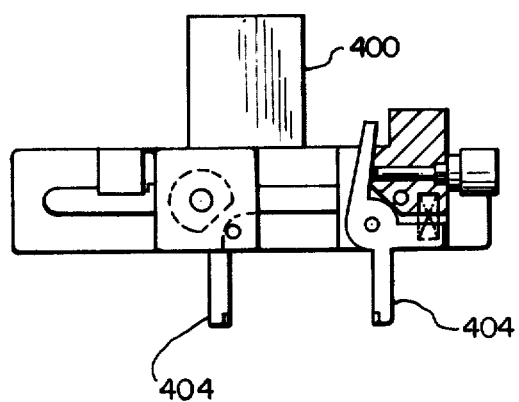

FIG. 16 is an elevational view taken along the line 16—16 of FIG. 1.

GENERAL DESCRIPTION

Figure 2:
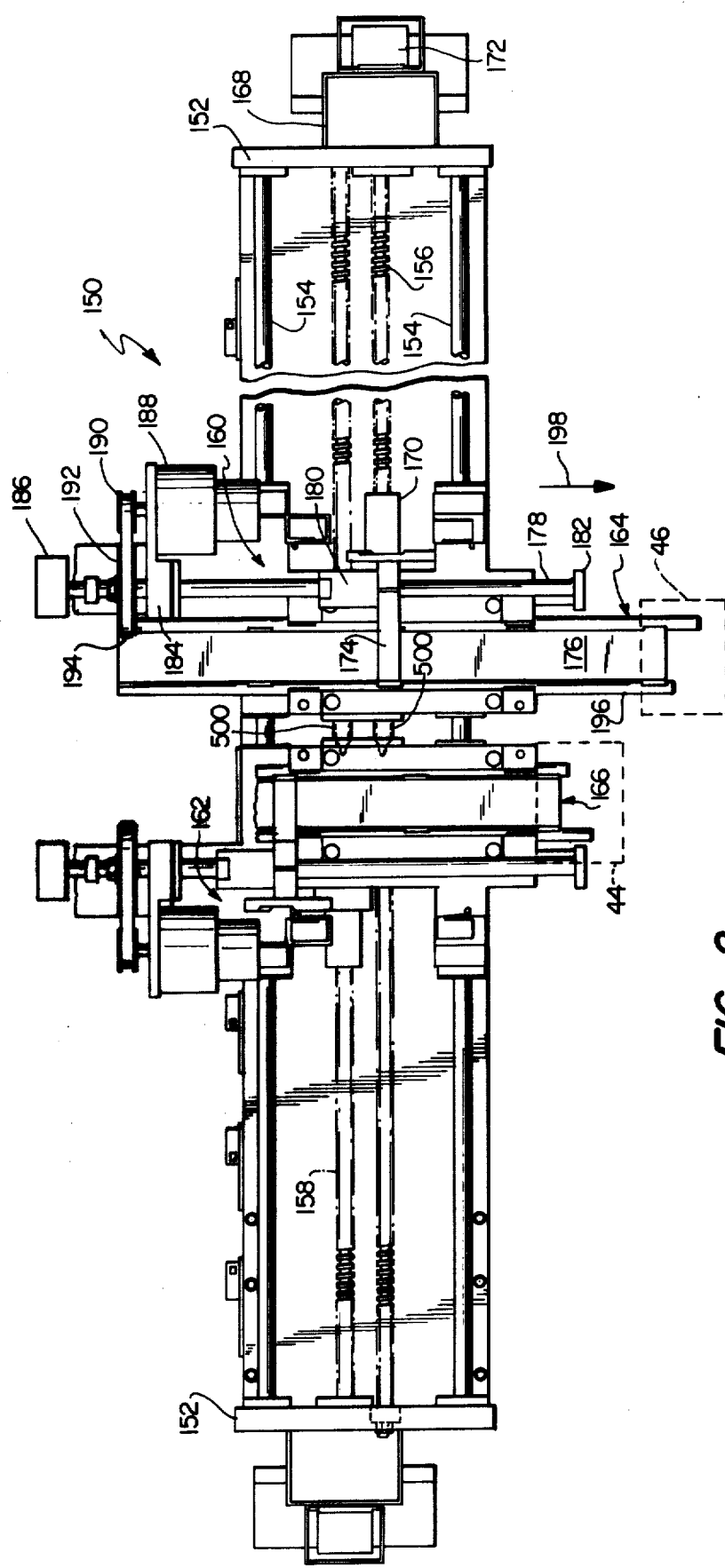
FIG. 2 is a partial plan view of the X-Y positioning apparatus shown partially cutaway in FIG. 1.

With reference to FIGS. 1, 2, the automated circuit board assembly apparatus 10 of this invention includes a substantially flat, circular indexing table 12 mounted for rotation about a central vertical shaft 14. The drive means (not shown) for rotation of the indexing table 12 is located below the table top surface 18, and indexing table 12 and drive means are fastened to the main support platform 20. The platform 20 is elevated on legs 22 such that the circular indexing table 12 is at a level convenient for an operator to load substrates onto the table 12 as described more fully hereinafter.

An array 24 of load trays 26, disposed substantially symetrically relative to the table shaft 14, stand behind the table 12 at substantially the same elevation as said table 12. The trays 26 hold chip components 40 of various types, a plurality of one physical size, type an value of chip being loaded in a regular pattern in each tray 26.

The indexing table 12 provides four nests 28 equally spaced around the periphery of said table 12 wherein a substrate 30 is rigidly but removably grasped after insertion by the operator. The table 12 is indexed clockwise in four equal steps of ninety degrees such that each nest 28 in turn is at the load station 12 adjacent the operator (not shown) who manually inserts a preprinted substrate 30. When the table 12 is indexed by ninety degrees, the nested substrate 30 is located at the fluxing station 34 where a coating of flux is automatically applied to the upper substrate surface. The flux serves to clean the conductor surfaces for subsequent soldering and acts as an adhesive to bind the component chips 40 to the substrate 30 after placement and prior to soldering.

Upon the next indexed motion of ninety degrees of the table 12, the fluxed substrate 30 is located at the population station 36 where component chips 40 are placed on the substrate 30 in the variety, pattern and orientation which are required by the circuit printed on the substrate 30.

After the substrate 30 is populated, the table 12 is indexed ninety degrees to the unload station 38 where the populated substrate 30 is automatically unloaded onto a conveyor 42 which carries it to its next operation, for example, soldering.

The table indexing is continuous although the timed intervals between indexing may be irregular in duration depending upon the number of components which are placed on a particular substrate 30 at the population station 36. Each empty nest 28 is loaded by the operator such that four substrates 30 are, except at start-up and run-completion, normally in process simultaneously, one at each station.

Behind the table 12 and partially over the tray array 24 are positioned a pair of head assemblies, a left head assembly 44 and a right head assembly 46, which are independently capable of motion in the X-Y horizontal planes, as defined in FIG. 1. For clarity in illustration in FIG. 2, the locations of head assemblies 44, 46 are indicated by broken lines. FIGS. 4, 7-13 furnish detailed illustration of these head assemblies.

When moved rearward in the Y direction and traversed left or right in the X directions, the head assemblies 44, 46 can travel over the arrayed load trays 26 and are able to pick up individual chip components 40 from any tray 26. Where two head assemblies are used, as in FIG. 2, for practical reasons, to avoid physical interference between head assemblies, the right head assembly 46 may be dedicated to service the component trays 26 to the right of the shaft 14 and the left head assembly 44 services the component trays 26 to the left of the shaft 14. However, such a restriction is not a necessity and under computer control, either head assembly may select components from any component tray. In response to X-Y instructions from a computer on other programmed controller (not shown) a head assembly moves over a tray 26 holding a desired chip component; a hollow, vertical, spindle 48 using an internal vacuum descends to attach to a component 40 in the tray 26. The spindle 48 holding the selected component 40 is elevated; the head assembly traverses in the X-Y planes until it is over the desired position on the substrate 30 which is fixedly located at the populate station 36 on the circular table 12. The chip 40 is oriented by rotation of the spindle 48, and a centering device 298 precisely centers the chip 40 on the spindle 48. The spindle 48 then descends until the component 40 is pressed with a predetermined force onto the fluxed surface of the substrate 30 where it adheres until a permanent solder bond is accomplished. The method and apparatus for producing the permanent bond is not considered to be part of this invention. The vacuum within the spindle 48 is removed and a slight positive pressure is provided to release the chip component 40. The spindle 48 is raised, whereafter the head assembly is directed in accordance with the control program to select another component 40 from a tray 26 and repeat a similar sequence of operations. Each head assembly operates independently of the other, except that chips 40 may be placed on the substrate 30 alternately by each head assembly, one head assembly waiting before placing its chip 40, until the other head assembly has placed a chip 40 and withdrawn again toward the load trays 26.

After population of the substrate 30 has been completed, the table 12 is indexed another ninety degrees, placing the substrate at the unload station 38 where the unload assembly 398 operates to clasp the populated substrate edges from above. The substrate 30 is released from its nest 28, raised by the unload assembly, rotated horizontally and lowered onto a conveyor belt 42.

The table 12 is not indexed at any time until sensors (not shown) indicate that the task to be performed at each of the four statins has been completed.

LOAD STATION 32

A nest 28 is comprised of a generally rectangular plate 52 (FIGS. 3a, b) which is fastened by bolts 54 to the circular indexing table 12 in a precisely aligned position as etermined by three square pins 56 which extend vertically from the table surface 18. The square pins 56 are precision machined of dimensionally stable material, e.g., carbide steel, and are precisely positioned and oriented such that a rectangular or square object, such as a substrate 30, can nest between the perpendicular planes formed by the three pin surfaces, with two pins 56 aligning with one edge of the substrate 30 and one pin 56 aligning with the adjacent edge. The pins 56 are held in precision machined vertical slots 58 in the plate 52 and extend both above and below said plate 52.

Below the plate 52 the very same planar surfaces of the pins 56 which are used above to nest a substrate 30, press against precision machined edges (not shown) cut in the metal of the indexing table 12. The machined edges (not shown) of the indexing table 12 for each nest 28 are machined when the table 12 is mounted on its shaft 14 and bearings (not shown), and physically set so that during machining, each particular nest 28 is located at the populate station position 36.

Above the plate 52, the pins 56 provide alignment for the substrate platform 60 which is fixedly but removably attached to the plate 52 by bolts 62. Five flat integral bosses 64 located generally at the center and corners, are raised above the platform 60, and provide the surfaces on which the substrate 30 is held as it moves from the load station 32 to the subsequent stations 34, 36, 38. It is noteworthy that it is the three vertical pins 56 and not the substrate platform 60 which provide the precision alignment and positioning of the substrate 30. Thus, different sizes of platforms 60 and different sizes of substrates may be utilized while always maintaining the precise reference location of substrates against the invariably positioned pins 56.

A pair of pivoting latches 66 located ninety degrees apart, when in the closed position (FIGS. 3a,b) extend within the edges of the substrate platform 60 such that when a substrate 30 is in position, the latches press laterally upon the two perpendicular edges of the substrate which are not engaging a square pin 56. Simultaneously, the overhanging lip 68 of the latches 66 prevents a positioned substrate 30 from moving vertically from the nest 28. Each latch 66 is mounted for pivoting around a pin 70 and a force 72 acting below the pivot pin 70 is provided in any suitable manner, e.g., spring, solenoid plunger, pneumatic piston, which maintains the latch 66 in a normally closed position. (FIG. 3b) Application of a force 74 above the pivot pin 70 causes the latch 66 to swing away from the substrate platform 60 releasing a positioned substrate 30 from the lip 68 or permitting the operator to insert a new substrate into an empty nest 28.

At the load station 32, the unlatching is accomplished automatically by the action of a pneumatic cylinder (not shown) but it may also be accomplished by the operator who presses inward, as indicated by the arrow 76, on the handle 78 and causes the latches 66 to pivot away from the platform 60 in opposition to the closing normal force 72. A common linkage (not shown) engages both latches 66 so the latches 66 pivot in unison. The operator inserts a substrate 30 to be populated into the nest 28, resting it upon the bosses 64 of the substrate platform 60. Upon release of the handle 78, automatically or by the operator, the latches 66, responding to the normal closing force 72, precisely secure the substrate 30 which has been inserted by the operator, pressing and aligning the substrate 30 against the three square pins 56. The linkages (not shown) for moving the latches 66 are automatically actuated at the unload station 38 to release the substrate.

As a result of the machining method, as stated above, fixing the square pins 56 to the table 12, and use of these pins 56 to align the plate 52, substrate platform 60, and the substrate 30 itself (in conjunction with the latches 66), the X and Y axes of a nested substrate 30, located at the populate station 36, are respectively parallel with a high degree of precision to the X and Y planes respectively of the travelling head assemblies 44, 46 as more fully described hereinafter.

FLUXING STATION 34

After insertion of a substrate 30 into a nest 28, as described above, the table 12, with substrate, is automatically indexed ninety degrees clockwise by the drive means (not shown) placing the substrate at the fluxing station 34. The fluxing assembly 100 includes a stamp pad 102 attached releasably to an extended arm 104 which is able to pivot on the vertical shaft 106. The arm 104 is operated in one of two positions. In the first position, the stamp pad 102, FIGS. 5(a)(b), wet with flux, is located directly over the nested substrate 30 after it has been indexed to the flux station 34. Upon actuation of a solenoid (not shown), the shaft 106 descends vertically causing the wetted undersurface 108 of the stamp pad 102 to press momentarily upon the nested substrate 30 before rising again to its original level. The stamp pad 102 is approximatley of the same size and shape as the substrate 30 and applies an even coating of flux to the entire substrate top surface leaving only a narrow border of approximately one-sixteenth inch next to the edges of the substrate 30 to prevent the flux from contacting the nest pins 56 and latches 66.

The arm 104 is then pivoted (by means not shown) 180 degrees on the shaft 106 placing the stamp pad 102 above a mat 110 which is maintained continuously wetted with flux. When the next substrate 30 is indexed into the flux station 34, the solenoid (not shown) causes the pad 102 to descend until its lower surface 108 is wetted by the mat 110. The stamp pad 102 is then raised and pivoted 180 degrees to be again over the flux station 34 and the next substrate 30 where the fluxing step described above is repeated.

The lower surface 108 of the stamp pad 102 (FIGS. 5a,b) is comprised of parallel rows of square lands having coplanar face surfaces 114 raised above the base 116 of the pad 102. Additionally on the lower surface 108 alternate rows of square lands have coplanar face surfaces 118 raised, but by a slightly lesser distance 120 than the surfaces 114, above the base 116 of the pad 102. The stamp pad is fabricated of rubber or other suitable resilient material and is backed by a rigid member 122. Although the wetted undersurface 108 is not a single continuous planar surface, the spacing of lands 114, 118 produces a uniform continuous fluxed surface on the substrate 30 without gaps in the flux when the pad 102 is pressed onto the substrate 30 at the fluxing station 34 as aforesaid. Sufficient pressure is applied and the pad 102 is sufficiently resilient such that all land surfaces 114, 118 contact the substrate 30. When the pad 102 is raised after fluxing the substrate, the lower land surfaces 118 separate from the substrate 30 while the higher land surfaces 114 still contact the substrate 30 and help to maintain its nested position. Thus, the surface tension forces between fluxing pad 102 and substrate 30 are broken in steps, and less stress is produced on the substrate 30 during the process of separation.

A stamp pad 102, having lands 0.100 inch square in rows and columns separated by 0.100 inch, and with the higher lands 114 being 0.060 inch above the base 116, and the lower lands 118 being 0.050 inch above the base 116, performed satisfactorily in providing a uniform flux coating over a preprinted substrate surface suited to hybrid circuitry.

The fluxing mat 110 is comprised (FIG. 6) of a short length of resilient, flexible wicking material draped, as an inverted U, over a rigid support 124 which rests in a shallow pan 126 filled with flux 128. The ends 130 of the mat 110 rest in the flux 128, and the support 124 maintains the horizontal mat surface upon which the stamp pad 102 is impressed for wetting, above the flux level 132. In the known manner, flux 128 which transfers from the mat 110 to the stamp pad 102, is replaced by the wicking action of the mat material. A removable cover 134, shown by broken lines in FIG. 6, having a rectangular opening 136 therethrough provides access for the stamp pad 102 to reach the mat 110 while reducing evaporation and contamination of the flux 128.

POPULATION STATION 36

When the table 12 is indexed next in another clockwise step of ninety degrees, as stated above, the substrate 30, with a thin coating of tacky flux substantially covering its upper surface is located at the population station 36. The population station is comprised of the array 24 of component trays 26, a left hand and right hand head assembly (44, 46 respectively) and an X-Y positioning apparatus 150.

FIGS. 1 and 2 shows the X-Y positioning apparatus 150 with the head assemblies 44, 46 omitted for purposes of clarity in illustration. The X-Y positioning apparatus is attached to the main support platform 20 as fragmentally indicated in FIG. 1. Endpieces 152 stand vertically from the main support platform 20 substantially at opposite ends thereof and support the X-Y positioning apparatus 150. A pair of rigid, circular, horizontal guide rails 154 extend between the endpieces 152 and form a rectangle therewith as best seen in FIG. 2. The guide rails 154 are straight, precision machined and provide the X-axis reference of positioning apparatus 150. This X-axis parallels the X-axis produced by the squre pins 56 of the nests 28 as described above. Precision X-axis lead screws 156, 158 also extend parallel to the guide rails 154 between the endpieces 152 and are rotatably supported therein. Two X-axis traversing platforms 160, 162 move along the guide rails 154 each driven by one of the X-axis lead screws 156, 158. Each X-axis traversing platform bears a Y-axis traversing platform 164, 166 which in turn bears one of the head assemblies 44, 46 as described more fully hereinafter. Lead screw 158, X-axis platform 162, and Y-axis platform 166 cooperate to give X-Y traversing motion to the left head assembly 44. Lead screw 156, X-axis platform 160, and Y-axis platform 164 cooperate to give X-Y traversing motion to the right head assembly 46. The left assemblage mirrors the right assemblage (FIG. 2). Accordingly, the following description is presented with reference to the right hand assemblage with the understanding that the description is applicable, as well as to the left assemblage, with any adjustment as may be required for other-handedness.

The precision lead screw 156 connects for rotation to the output of the servo motor 168. The lead screw 156 passes through a recirculating ball nut assembly 170 of known design which is integral with the X-axis traverse platform 160 whereby when the servo motor 168 rotates the lead screw 156 in one direction the X-axis traverse platform 160 translates to the right. Conversely, when the servo motor 168 rotates the lead screw in the opposite direction, the traverse platform 160 translates to the left. An encoder 172 connects to the precision lead screw 156 via a speed reduction device (not shown) and outputs signals indicative of every rotation of said lead screw 156 to the computer (not shown) which controls operation of the circuit board assembly apparatus 10 of this invention. Encoders are well known in the machine control art and need no further description here; with suitable speed reduction and high precision construction including the lead screw 156 and ball nut assembly 170, X positioning with an accuracy of ±0.0005 is achieved.

As stated above, the Y-axis traversing platform 164 mounts translatably to the X-axis traversing platform 160. The flange 174 stands vertically from the horizontal planar surface 176 of the Y-axis traversing platform 164. A precision Y-axis lead screw 178 at right angles to the X-axis lead screws 156, 158 passes through the flange 174 and a recirculating ball nut assembly 180 which is fixedly attached to said flange 174. The lead screw 178 is rotatably supported at one end in the bearing 182 which in turn is mounted rigidly to the X-axis traversing platform 160. The other end of the lead screw 178 extends through a bearing 184 and connects to an encoder 186. The servo motor 188 mounts to the housing of the bearing 184 and drives the lead screw 178 via pulleys 190, 192 connected by a sprocket belt 194 to effect a speed reduction between the rotation of the servo motor 188 and lead screw 178. The housing of the bearing 184 mounts to the X-axis traversing platform 160.

Two circular, guide rails 196 extend (FIGS. 2, 4) parallel to the Y-axis and are attached rigidly to the planar surface 176 of the Y-axis traversing platform 164 as more fully described hereinafter. These guide rails 196 extend back and slidingly fit within recirculating ball bushing halves (not shown) in the X-axis traversing platform 160. The guide rails 196 and receiving bushings are precisely machined such that the Y-axis traversing platform 164 slides horizontally forward, as indicated by arrow 198, on the guide rails 196 parallel to the Y-axis when the servo motor 188 rotates in one direction, and retracts when the servo motor 188 rotates in the other direction. The encoder 186 feeds signals to the computer (not shown) indicative of the Y position of the Y-axis traversing unit and provides control with an accuracy of ±0.0005 inch.

In FIG. 2, the right hand Y-axis traverse platform 164 is illustrated in a more forward position than the left hand Y-axis traverse platform 166. From this advanced position, placement on a substrate 30 of a component chip 40 by the right head assembly 46 is accomplished.

The right head assembly 46 mounts to the planar surface 176 as seen most clearly in FIG. 4. The planar surface 176 is part of the rectangular channel which attaches at its forward end to the head block 200. The guide rails 196 are rigidly attached to the head block 200 in any suitable manner.

The circular spindle 48 which has been precision machined, passes vertically (FIG. 7) through the block 200 being supported thereto for rotational and vertical translational motion. The spindle housing 202 is fixedly attached to the block 200 and internally includes two vertically spaced apart precision bushings 204 in which the spindle 48 rotates and slides. The spindle 48 is not directly in contact with the spindle housing 202, a clearance being provided there between such that an annular chamber 203 (FIG. 8) surrounds the spindle 48 within the spindle housing 202 as explained more fully hereinafter. The spindle housing 202 is generally circular and concentric with the spindle 48.

A pulley 206 having a shaft 207 is mounted for rotation atop the block 200 with its periphery concentric with the spindle 48 which passes through said pulley 206. Bearings 208, 210 rotatably receive said shaft 207 and are press fitted into the block 200. An elongated vertical, circular sleeve 212, having a narrow vertical slot 214 is rigidly attached to the upper surface of the pulley 206. The ball bearing screw 216 passes through the slot 214 and is fastened into the spindle 48; allowing smooth friction-free rolling of the bearing 216 vertically along the slot 214. As a result of this construction, the spindle 48 is always able to move vertically in either direction sliding in the bearings 204 as aforesaid. In addition, when the pulley 206 is rotated, the spindle 48 rotates with it, driven by the slotted sleeve 212 acting against the bearing 216. Accordingly, either vertical or rotational motion of the spindle 48 may be accomplished independently of the other motion.

The spindle 48 is driven for rotation by the stepper motor 218 fixed to the block 200 by a mounting bracket 220. The pulley 222 on the shaft of the motor 218 is connected to the spindle pulley 206 via the O-ring belt 224. Both pulleys 206, 222 are of the same diameter such that any degree of rotation of the stepper motor 218 is directly reproduced by the spindle 48.

The spindle 48 is driven vertically by an elongated arm 226 (FIGS. 4, 7, 9, 10) pivotably engaging the channelled disk 228 which is fixedly attached to the top of the spindle 48. The channel 230, which encircles the disk 228, is rectangular in cross-section and is engaged by a pair of opposed circular pins 232 which extend horizontally from both branches of the yoke 234 which comprises the end proximate the spindle 48 of the elongated arm 226. The pins 232 ride slidingly in the rectangular channel 230 applying the forces as required to vertically elevate and lower the spindle 48 without inducing longitudinal bending stresses in said spindle 48, and permitting unconstrained rotation of the spindle 48 in response to the stepper motor 218 regardless of the spindle's elevation.

The opposite end of the elongated arm 226 is pivotably mounted to the post 236 by the shaft 238 which provides for rotation of the arm 226 in a vertical plane. A set screw 240 is threaded through the end of the arm 226 and abuts an extension 244 from the post 236. A nut 246 locks the setting of the screw 240 and limits the elevation of the spindle 48.

An air actuated piston 248, sliding in a vertical cylinder 250, is connected by a link 252 to the elongated arm 226 at a location between the pivot shaft 238 and the yoke 234. A boss 254 (FIG. 9), attached to the arm 226 receives a threaded fitting 256 therein and the link 252 is pivotably joined at one end 258 to the piston 248 and at the other end 260 to the threaded fitting 256. A source of compressed air and vacuum generally indicated in FIG. 9 by the number 262 provides either a positive or negative pressure in the cylinder chamber 264 as required; a positive pressure driving the piston 248 upwardly and raising the spindle 48 until the set screw 240 prevents further motion, and a negative pressure drawing the piston 248 and spindle 48 downward. The piston 248 and cylinder 250 operate with a soft dashpot-like action providing gentle motion of the spindle 48 in placing component chips 40 on a substrate 30 as described hereinafter. The degree of vacuum in the cylinder chamber 264 determines the force which the spindle 48 brings to bear in placing the chip 40 on the substrate 30. This force is varied by varying the gas pressure to the chamber 264 to suit the components and substrates which are being operated upon.

The lower end of the spindle, as best seen in FIG. 8, is hollow and the hollow chamber 268 is generally sealed except for the tip 266 extended therefrom. The tip 266 is a hollow tube of small diameter, the passage through said tube 266 communicating with the chamber 268 within the spindle 48. A small transverse hole 270 passes through the spindle 48 and communicates with the chamber 268 and with the annular chamber 203 between the bushings 204 and spindle housing 202. A duct 272 connects the annular chamber 203 to a variable pressure source (not shown) of air via a restricted fitting 274. When the lower end of the tip 266 contacts a component chip 40 resting in a load tray 26, a reduced gas pressure, produced within the spindle chamber 268 by said variable pressure source, causes the chip 40 to attach to the tip 266 and be lifted from the tray 26 when the spindle 48 is elevated. When the chip 40 is pressed onto a fluxed substrate 30, the vacuum within the spindle chamber 268 is released. As the spindle 48 is elevated, the internal spindle pressure is reversed providing a positive pressure which in essence frees the component chip 40 from the tip 226 and assures retention, without displacement of the chip 40, on the fluxed substrate 30 as the spindle withdraws.

The level of vacuum within the spindle 48 indicates whether a chip 40 has been successfully picked up from a load tray 26. A vacuum switch (not shown) operates responsively to the spindle pressure which is sensed at a location between the chamber 268 and the restricted fitting 274. When a chip 40 has been picked up by the tip 266, the external inlet to the spindle chamber 268, annular chamber 203 and duct 272 is effectively sealed from the external ambient atmosphere. In this condition the internal spindle pressure is pulled down to equal the pressure of the vacuum source (not shown). When a chip 40 is not present at the tip 266 the pressure within the spindle chamber 268, annular chamber 203, and duct 272 will be more positive. As discussed hereinafter, this pressure change which occurs when a chip 40 is properly attached to the tip 266 is used as a control in operation of the head assembly 46. The restricted fitting 274 between the vacuum source (not shown) and the spindle chamber 268 provides a greater pressure differential to distinguish the presence or absence of a chip 40 on the tip 266 than would be available if no restricted fitting were used. When a chip 40 is properly retained on the tip 266, air flow is effectively blocked through the spindle 48 and pressure within the spindle 48 and pressure within the spindle chamber 268 is the same whether or not a restricted fitting 274 is used. However, with the restricted fitting 274, and absent a chip 40, the pressure in the spindle chamber 268 remains relatively high because a substantial flow pressure drop occurs across the restricted fitting 274. Without the restricted fitting 274, substantially all the flow pressure drop occurs at the inlet to the tip 266 and accordingly the spindle chamber pressure is substantially equal to the vacuum source pressure.

Spindles 48 having different diameter tips 266 may be interchanged for use with different sizes of components 40.

FIGS. 7, 8 illustrate the spindle 48 in the raised position. Parts 48' and 228', shown with broken lines in FIG. 7 indicate a lowered position of the spindle.

COMPONENT CENTERING DEVICE 298

As stated above, a chip 40 selected from a storage tray 26, or linear vibrating feeder (not shown) or feeder bowl (not shown), can be raised, lowered, rotationally oriented and precisely translated in the X-Y planes by the head assembly 46 and the X-Y positioning apparatus 150. However, this apparatus would only be sufficient for precision placement of component chips 40 on precisely held substrates 30 if each component 40 was stored or made available at a precisely known X-Y position and orientation at the moment of pick-up by the spindle tip 266. Additionally, the position of the chip 40 on the tip 266 would have to be maintained from the time of pickup to the time of placement on a substrate 30. As explained hereinafter, the component centering device of this apparatus eliminates the need for precise location of chips 40 at the time of pickup.

As best seen in FIGS. 7 and 11, there are two pair of opposed, linear grooves 300, 301 near the top of the spindle housing 202. One pair of grooves 300 have their apexes parallel to the Y-axis; the apexes of the other pair 301 parallel the X-axis. A pair of opposed X-axis locators 302 (FIG. 7) engage the pair of V-grooves 300 parallel to the Y-axis and are pivotably suspended therefrom. Each X-axis locator 302 is comprised of a head 304 and a foot 306 connected by a shaft 308. The head 304 includes a knife edge 310 which engages a V-groove 300 with a minimum of resistance to pivoting of the X-locators 302. A "C" shaped spring clamp 312 loops around (FIG. 4) to press with equal force on the outer surface of both heads 304 as indicated by the arrows 314 to hold the locators 302 in the V-grooves 300 and to provide a slight spring bias which tends to move the feet 306 toward the spindle 48. Cam surfaces 316 are provided on the inside of the feet 306 facing the spindle 48 and tapering downward toward the spindle tip 266. The feet 306 extend inwardly below the spindle housing 202 presenting two opposed planar surfaces 318 (FIG. 8) which are perpendicular to the X-axis.

As best seen in FIGS. 4 and 11, a pair of opposed Y-axis locators 320 engage the pair of V grooves 301 parallel to the X-axis and are pivotably suspended therefrom. Each Y-axis locator 320 is comprised of a pair of flat surfaced head pieces 322 (FIG. 12) having knife edges 324 which each engage a V-groove 301 with a minimum of resistance to pivoting of the Y-axis locators 320. Between the flat surfaces of the head pieces 322 are located symetrically in sandwich fashion a pair of thin, flat elongated fingers 326, a pair of spacers 328 each adjacent a finger 326, and at the center a cam 330 adjacent the spacers 328. Bolts 332 passing through the assemblage and threaded into one head piece 322 rigidize the Y-axis locator 320. The fingers 326 extend inwardly below the spindle housing 202 toward the spindle tip 266 and are of thin metal. A thickness in the order of 0.005 inch has performed satisfactorily. The cam 330 is shorter than the fingers 326 and does not extend beneath the spindle housing 202. Both the fingers 326 and the cam 330 have the cam surface 334 tapering downward toward the spindle tip 266. The overall thickness 336 including the fingers 326 is sufficiently small such that the extended ends 338 of the fingers 326 may enter between the perpindicular surfaces 318 of the feet 306 of the X-axis locators 302 when said locators 302 are pivoted most closely together. This most closed position of the X-axis locators 302 is determined by contact of the feet 306 against the side surface of the spindle housing 202. Each pair of innermost edges 340 in a Y-axis locator 320 are parallel and define a plane paralleling the X-axis.

A "C" shaped spring clamp 341 loops around (FIG. 4) to press with equal force on the outer surface of both cams 330 to hold the Y-axis locators 320 in the V-grooves 301 and to provide a slight spring bias which tends to move the finger tips 340 toward the spindle 48. As seen in FIGS. 4, 7, 8, 11, the feet 306 and fingers 326 are arrayed symetrically about the spindle housing 202 in position to contact the side edges of a component chip 40 which is held by vacuum on the tip 266 of the spindle 48 when said spindle 48 is in an elevated position.

A central cam 342 fits slidingly over the spindle housing 202 and is concentric therewith. (FIGS. 4, 7, 11) The central cam 342 is driven vertically by a linear actuator 344 mounted on the block 200 and connected to extensions 346 from the central cam 342 by a drive rod 348. The linear actuator 344 may be of any suitable type e.g., a solenoid device, but an air operated piston having a gentle dash-pot action if preferred, operating similarly to the piston 248 and cylinder 250 which provides vertical motion for the spindle 48 as aforesaid. As the central cam 342 is lowered, there is engagement between the rounded lower cam surface 350 and the cam surface 316 of the feet 306 and with the cam surface 334 of the locator cam 330. When the central cam 342 is fully lowered (FIG. 13), the feet 306 and fingers 326 are pushed outwardly clear of the spindle tip 266 and any chip 40 which may be attached thereto. As the central cam 342 is slowly elevated by operation of the linear actuator 344, and drive rod 348, the rounded surface 350 slides upward first along the foot cam surface 316 causing the feet 306 to pivot slowly together. The height 352 of the vertical foot surface 307 is less than the height 354 of the vertical cam and finger surfaces 335 such that as the cam 342 rises, the feet 306 swing fully inward before substantial change occurs in the position of the fingers 326. As the central cam 342 continues to rise, the surface 350 slides upward along the cam surface 334 and the fingers 326 pivot inwardly. As seen in FIGS. 7, 11, the central cam 342 is disengaged from the fingers 326 and feet 306, when the cam 342 is in its maximum upward position.

When the spindle 48 is lowered to pick up a chip 40 from a tray 26, the central cam 342 is down FIG. 13, the fingers 326 and feet 306 are apart and the spindle tip 266 extends below the axis locators 302, 320. For purposes of illustration here, the selected chip 40 is assumed to be square or rectangular and after attachment to the spindle 48 is misaligned relative to the vertical axis of the spindle tip 266. The spindle 48 is then elevated, and the attached chip 40 may then be angularly oriented, if required, by rotation of the spindle 48 by the stepper motor 218. The chip 40 is then given X-Y translation to the programmed location over the substrate 30 by the positioning apparatus 150 as aforesaid. At this point, the central cam 342 is slowly elevated causing the feet 306 to pivot inwardly on the knife edges 310, 324 until contact is made with the misaligned chip 40. If the chip is misaligned in the positive X direction, the right foot 306 will first contact the chip 40 and push it toward the opposing foot 306, and vice versa if the misalignment is X-negative. As a result of the force of the C spring 312 and the weight of the locators 302, the chip 40 will be pushed into a centered X position on the spindle tip 266 and oriented with two straight edges aligned to the Y-axis. The width 356 of the planar surfaces 318 assures alignment of all sizes of chips 40.

As the central cam 342 continues to elevate the fingers 326, acted upon by the C spring 341, pivot inwardly until contact is made with the misaligned chip 40. If the chip is misaligned in the positive Y direction, then the forward fingers 326 will first contact the chip 40 and push it toward the opposing fingers 326, and vice versa, if the misalignment is negative. As a result of the force of the spring 341 and the weight of the locators 320, the chip 40 will be pushed into a centered Y position on the spindle tip 266, with edges now aligned to both the X and Y axes. The chip is now entirely centered on the spindle tip. It will be appreciated that a chip 40 which was already centered but angularly disoriented at the time of pickup will be both centered and oriented after action of the centering device 298.

The cam 342 is then lowered by actuation of the linear actuator 344, spreading apart the fingers 326 and feet 306 and leaving the centered and oriented chip 40 at the tip 266 of the spindle. The spindle 48 is then lowered to press the chip 40 onto the fluxed upper surface of the substrate 30. The chip 40 is released from the spindle 48 as described above, and the spindle 48 is elevated prior to its translation to select another component 40 from another tray 26 in accordance with the requirements of the substrate circuit as directed by the computerized control system (not shown). Both head assemblies 44, 46 operate to alternately place chips 40 on a substrate 30.

UNLOAD STATION 38

After the substrate 30 has been populated with chip components 40, the table 12 is again indexed ninety degrees clockwise bringing the populated substrate 30 to the unload station 38. There, an arm 400 pivotably-mounted for rotation with the vertical shaft 402 swings over the substrate 30. The arm 400 is lowered vertically by activation of a piston (not shown) and two opposed fingers 404 (FIG. 16) move together to grip the substrate 30 therebetween. The latches 66 of the nest 28 are then automatically operated to release the substrate 30 from the nest 28 by the application of a force 74 (FIGS. 3(a) (b) above the pivot pin 70, as previously described. This force 74 causes the overhanging lips 68 of the latches 66 to move away from the substrate 30. The arm 400 is raised vertically removing the substrate 30, held by the fingers 404, from the nest 28 and pivoted about the shaft 402 until the substrate 30 is above the conveyor belt 42. Whereupon the arm 400 is lowered until the substrate 30 rests on the conveyor belt 42 and the fingers 404 are separated to release the populated substrate 30. The conveyor belt 42 carries the substrate 30 to the next work station, e.g., soldering.

Details of the mechanisms by which the arm 400, fingers 404, and conveyor 42 are actuated are not considered to be a novel part of the disclosed invention and, accordingly, are not given a fully detailed description herein.

COMPONENT ARRAY 24

As previously stated, a variety of component chips are maintained in load trays 26 which are located behind the indexing table 12 so as to be available to the spindle tip 266. The load trays 26 include a planar surface 440, whcih is compartmentalized by a rectangular grid 442 which is integral with the planar surface 440 and raised therefrom to provide a plurality of rectangular compartments 444 of equal size and shape. The grid 442 is enclosed by a square frame 446 of equal height with the grid 442, and the planar surface 440 is supported on the integral base 448, which has a rectangular recess 450 in the lower surface 452.

The trays 26 are precisely molded of rigid plastic. The compartments 444 are of uniform size and shape and precisely spaced one from the other and from the vertical edges 454 of the base 448 and the vertical edges 456 of the recess 450. These vertical edges 454, 456 are precision molded. Trays 26, suited to use with the apparatus 10 of this invention, are manufactured by Fluoroware Inc., Chaska, Minn.

The trays 26 are placed in the array 24 on uniformly spaced centers, a boss (not shown) fixed to the main support 20 nests within the recess 450 of each tray 26 to precisely position the tray 26 relative to the X-Y axes defined by the three square pins 56 in the indexing table 12 as described above. The beveled corner 451 guides the operator to properly orient the tray 26 during installation in the array 24. Accordingly, the X-Y position is determined for every compartment 444 of every tray 26 in the array 24 of components 40 available for selection by the head assemblies 44, 46. Each tray 26 stores in inventory one type and size of component chip 40.

Within a tolerance, as described hereinafter, each component 40 is placed in an individual compartment 444 with a predetermined orientation. For the sake of an example, if square chips have a triangular pattern of three solder bumps, A, B, and C, all chips are loaded into the compartments 444 with bump A at the top (as seen in FIGS. 15(a) (b) (c) ) and with all bumps adjacent the surface 440. After selection by the spindle 48, the attached chip 40 may be oriented 90, 180 or 270 degrees from its stored position by the stepper motor 218 and then centered on the spindle 48 as described above. Because of the action of the centering feet 306 and fingers 326, it is not necessary that the components 40 precisely fit within their storage compartments 444. Any rectangular shape of compartment 444 which does not allow an excess rotation of the stored rectangular chip 40 and does not allow excess translation of the chip in X and Y directions within the compartment 444 provides adequate storage for the chip 40. After centering of the attached chip 40 on the spindle tip 266, the location and placement on the substrate 30 of the chip 40 is as precisely established as if the chip had been precisely positioned at a known location prior to pickup.

Figure 15B:
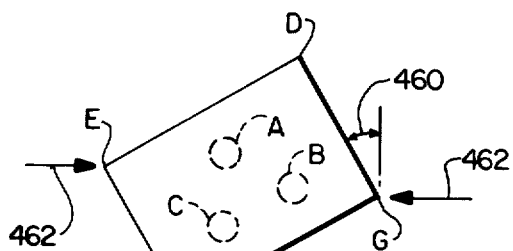
Figure 15C:
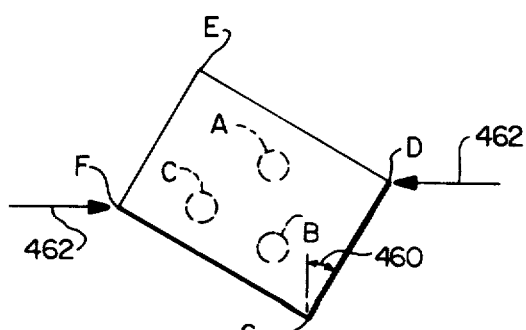

The degree of rotation of a chip 40 which is permissible in the compartment 444 is that which allows the X-axis locators 302, which act prior to the Y-axis locators 320, to true up the misoriented chip 40. A square chip can be misoriented in its compartment 444 by an angle 460 approaching ± 45° (See FIGS. 15(b) (c). ). The forces 462 of the locators 302 acting on the corners E, G, for counterclockwise misorientation, FIG. 15(b) will return the chip to the the X-Y orientation shown in FIG. 15(a), as will the forces 462 acting on the corners D, F, for clockwise misorientation (FIG. 15(c). It will be noted that the action, after pickup, of the stepper motor 218 in rotating a chip by 90, 180, or 270 degrees will not affect the performance of the centering device 298 in producing a result as if the chip 40 had been precisely located in every axis prior to pickup by the spindle 48.

The acceptable degree 460 of misorientation of rectangular chips 40 depends on the length/width ratio of the chip and can easily be determined empirically for any chip. Any misorientation of a chip 40 in a compartment 444 which the centering device corrects is acceptable. Any degree of misorientation which the action of the centering device will increase to 90 degrees is unacceptable.

Translation of the stored chip 40 along the X-Y axes within the compartment 444 is acceptable so long as the opening in the spindle tip 266 is closed by contact between the chip 40 and tip 266. The computer control always directs the spindle to the geometric center of the compartment 444.

Accordingly, a wide latitude in physical chip sizes may be accommodated in a standard tray 26. For examples, component chips 40 having dimensions 0.078 W×0.081 L×0.022 inch thick including bumps have been acceptably stored in trays 26 having compartments 444 with dimensions 0.090 square×0.016 inch deep. Diodes 0.030 inch square have been acceptably stored in trays with compartments 0.037 inch square.

CONTROL

The computer controls each head assembly such that each time the spindle 48 returns to a given chip tray 26, the spindle 48 will descend over the next adjacent compartment 444 until all chips in a row have been selected; then the spindle begins to operate on the next row and so on until a tray is emptied. Failure to pick up a chip 40 from a particular compartment 444, causes the internal control program to automatically advance the spindle 48 to the next adjacent compartment 444 where another pickup is attempted. If this second attempt fails, a signal light (not shown) notifies the machine operator that the tray 26 is empty or the spindle 48 is malfunctioning. The signal which indicates the presence or absence of a chip 40 on the spindle tip 266 is derived from the level of vacuum inside the spindle chamber and passages 268, 203, 272 (FIG. 8) as described above. The presence of a chip 40 on the tip 266 is checked on first attachment of the chip 40 to the spindle 48, when the spindle is elevated, after operation of the stepper motor 218, and again after centering just prior to chip placement on the substrate 30. If the chip 40 is missing from the tip 266 after centering, the spindle 48 is translated to a predetermined stop position where it rests and allows the other head to complete its placement operation. A recycle light signal (not shown) tells the operator to press the recycle button (not shown) causing the head assembly which failed to place a chip 40 to return to the tray 26 and repeat the entire uncompleted operation. A positive pressure of gas in the spindle 48 is used to blow off any chip 40 which may be dangling from the spindle tip 266 when the recylce is initiated.

In placing a chip 40 on a substrate 30, the pressure exerted by the spindle 48 is varied generally in accordance with the area of "footprint" of the chip 40. This is accomplished by programming the pressure in the cylinder chamber 264 (FIG. 9) which actuates the arm 226 to provide vertical motion of the spindle 48 as described above.

Further, it shall be understood that sensors and interlocks (not shown) are used to prevent indexing of the table 12 unless both spindles 48 are elevated. Also all fluxing, populating and unloading operations stop should the indexed table 12 move from its proper lcoation at any time during those operations. Those operations never commence if the table 12 is not in proper position. Further, the table 12 will not index until operations are completed at all stations as indicated by sensors and interlocks (not shown).

During a table indexing step, a photocell (not shown) located between the load station 32 and fluxing station 34 detects whether a substrate 30 has been nested at the load station 32 prior to indexing. A signal from the photocell is fed to the computer (not shown) which prevents operation of the fluxing station 34 when the substrate 30 is absent, and after another indexing step prevents operation of the populate station 36 when a substrate 30 is absent.

The head assemblies 44, 46 are programmed to operate alternately but basically independently. Neither head waits on the other in the performance of its tasks of X-Y traversing, picking up and depositing chips 40, except that a head with an attached chip 40, stops at a hold position, and waits, if the other head is already over the substrate 30 in the population station 36. When the other head has completed its task and withdrawn from the population station 36, the waiting head is activated and advances to the population station 36.

Programming provides that the head assemblies do not collide, both by using the hold position described above and by having the left head assembly 44 select components from trays 26 on the left side of the array 28 and vice-versa for the right head assembly 44.

Additionally, feeler detectors 500 on the left side (FIG. 2) of the right hand X axis traversing platform 160 are actuated should they contact the left hand X axis traversing platform 162. Such contact stops opertion of the apparatus 10 and provides a signal (not shown) to the operator.

OPERATION

Following is a brief description of the operation of the automatic circuit board assembly apparatus 10 of this invention. This description is intended to give an overview of operation without attention to the details of construction already disclosed. A cycle of operation without malfunction is descirbed.

Loaded component trays 26 are placed in the array 24 with the trays properly oriented and with the components 40 properly oriented in their compartments 444 as described above.

The head assemblies 44, 46 have already been zeroed to give proper X-Y reference for all traversing. Zeroing is done by placing the lower round surface of the spindle housing 202 against the sides of a square pin 56 and inputting these positions to the computer. As stated above, the square pins reference all elements of the apparatus 10 and provide predetermined physical relationships between elements.

Figure 3A:
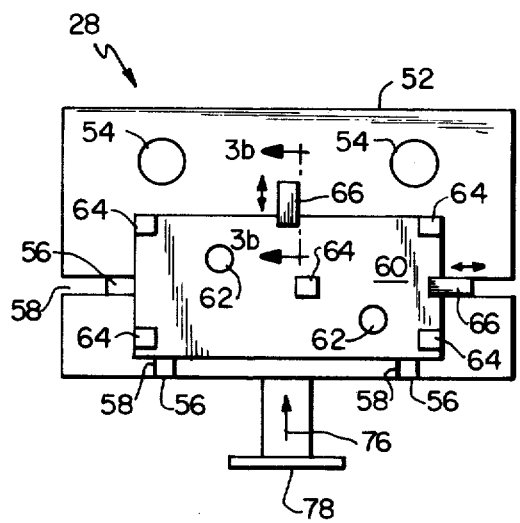
FIGS. 3(a) is a plan view to a larger scale of a nest of FIG. 1.
Figure 3B:
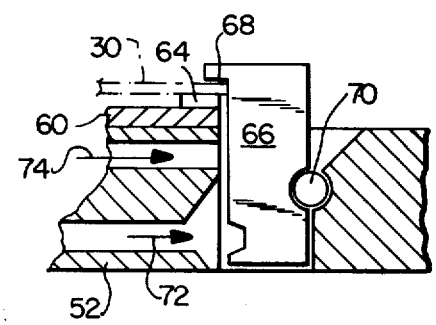
FIG. 3(b) is a partial section view taken along the line b-b in FIG. 3(a).

The operator (not shown) manually inserts a preprinted but unpopulated substrate 30 into the nest 28 (FIGS. 3(a) (b) ) at the load station 32. On pressing a control button (not shown), the latches 66 pivot inwardly to retain the substrate 30 against the square reference pins 56. The table 12 then indexes ninety degrees clockwise carrying the substrate 30 to the fluxing station 34. In travelling between the load and fluxing station, the presence of the substrate 30 in the nest 28 is detected by a photocell detector (not shown). At the fluxing station 34, the stamp pad 102, (FIG. 5), attached to the pivotable arm 104, descends to contact the wetted mat 110, FIG. 6, is elevated, and then rotated over the substrate 30. The stamp pad 102 is then lowered to press upon the substrate 30 leaving thereon a coating of tacky flux. Then the pad 102 is raised and rotated back to its initial position over the wetted mat 110, until the next substrate 30 is pesented for fluxing.

After the fluxing operation is completed, the table 12 is indexed clockwise by ninety degrees to present the fluxed substrate 30 at the population station 36. In accord with a program directed by the computer (not shown) and suited to the printed circuit of the subject substrate 30, a pair of head assemblies 44, 46 alternately place component chips 40 on the substrate 30. The chips 40 are pressed into the tacky flux by the hollow spindle 48 of the head assembly with a force suited to the chip "footprint" area. Air from the spindle tip 266 aids in holding the chip 40 in place on the substrate 30 as the spindle 48 is elevated. After chip placement and elevation of the spindle 48, the head assembly traverses in the X-Y directions, simultaneously, if necessary, to the tray 26 wherefrom the next component chip 40 is to be selected for placement. Because of this X-Y freedom of motion, the head assemblies may be directed to any tray 26 and to any compartment 444 in any tray 26, with a precision which is monitored by the drive shaft X and Y position encoders, e.g., 172,186. Placement of chips on the substrate 30 with X-Y precision is similarly accomplished.

When the spindle 48 is positioned over the desired component 40 in its storage tray 26, the spindle 48 is lowered into contact with the component chip 40. A vacuum produced within the spindle tip 266 then causes the contacted chip 40 to attach to the spindle tip 266 and remain there when the spindle 48 is elevated. The vacuum level within the spindle 48 indicates the presence of a properly attached chip 40 and is chip-presence tested before and after the spindle 48 is elevated. The stepper motor 218 is operated to rotate the spindle 48 with the attached chip 40 as required by the program by 90, 180 or 270 degrees. There is then a wait, if required, to allow the other head to finish operation and move clear of the population station 36. The head is then traversed in the X-Y directions to locate the chip 40 over the desired position for placement on the substrate 30. The cam 342 surrounding the spindle 48 is raised causing first the feet 306 to close together contacting and giving X alignment to the chip 40. Then, as cam 342 continues to rise, the fingers 326 close together contacting and giving Y alignment to the chip 40 on the spindle tip 266. The cam 342 is then lowered to open the centering elements 306, 326 leaving a centered and aligned chip 40 on the spindle 48. The continued presence of the chip 40 on the spindle is checked by again monitoring the vacuum level within the spindle 48, and the spindle 48 is then lowered to deposit the chip on the fluxed substrate 30 as aforesaid.

This cycle of operation is then repeated under computer control until the substrate has been fully populated in accordance with the substrate program requirements. As stated above the head assemblies operate alternately and the number of different type and physical and electrical sizes of components which can be placed on a substrate is limited only by the number, type and sizes of components which may be prestored in trays within the X-Y "reach" of the head assemblies. Flexibility is substantially unlimited.

After the substrate 30 is fully populated and both spindles 48 are raised, the table 12 is indexed another ninety degrees clockwise bringing the populated substrate 30 to the unload station where the arm 400 swings over the substrate 30 and descends so that the substrate may be grasped gently between the fingers 404. The latches 66 of the nest 28 are pivoted away from the substrate, and the arm 400 is elevated carrying the populated substrate 30. In sequence, the arm is rotated and lowered to place the substrate on a conveyor 42 where the fingers 404 open to release the substrate. The arm 400 is then raised.

The table 12 is again indexed by 90 degrees returning the now empty nest 28 to the load station 32 to receive another unpopulated substrate and repeat the cycle. There are four nests; accordingly, after each indexing of the table 12, there is an individual substrate 30 to be operated upon concurrently at each station.

The computer program, the storage array 28, and the nest 26 are easily changed to accommodate other circuits on other substrates.

From the preceding description of a preferred embodiment, it is evident that the objects of the invention are attained. Although the invention has been described and illustrated with detail, it is to be understood that the above is by way of illustration and example only and many modifications are possible which fall within the scope and spirit of this invention.

For example, in an alternative embodiment of this invention, an individual tray 26 with customized compartments 444 may contain an assortment of different individual components 40, for example, suited to populate a single substrate 30. These components 40 may be selected in regular compartment-sequence, or in any programmed order, to populate said single substrate 30 using a single head or in association with a second tray 26 and the second head assembly. Accordingly, an entire substrate may be populated using only one or two special trays.

Further it shall be understood that the apparatus 10 of this invention operating with the array 24 of trays 26 can be used, not to populate a substrate 30 as stated above, but to fill a customized tray with assorted components 40 in preferred compartments and orientations. In such an alternative embodiment of this invention, the fluxing operation would be omitted and the nests 28 and unload station 38 would be modified to accommodate trays rather than substrates. This resultant loaded customized tray could be transferred to and used in a less sophisticated component placement device, e.g., U.S. Pat. No. 3,909,922 described above, which moves the tray to a precise position for the pickup of each component.

Whereas trays 26 for storage of components 40 prior to pickup have been described above, in another alternative embodiment of this invention, the components 40 can be placed in position for pickup by means of bowl feeders or linear vibratory feeders. An apparatus 10 using trays 26, bowl feeders and linear vibratory feeders in combinations has operated satisfactorily.

In yet another alternative embodiment of this invention, the components 40 may be stored on an adhesive tape, the vacuum in the spindle 48 being sufficient to separate the component 40 from the tape for pickup. In another alternative embodiment of this invention, the spindle 48 may be magnetically operated to pickup suitable components 40 rather than using the vacuum tip as described above.

Whereas in the embodiment of this invention described above, the chips 40 which may be placed after orientation and centering are square or rectangular, it should be understood that in alternative embodiments of this invention, the chips 40 may be circular disks; symetrically oval and elliptically shaped chips may also be selected and properly placed on substrates provided the component's long dimension generally parallels the Y axis while the component is stored prior to pickup by the spindle. The centering device described above will be effective with such components.

Additionally, whereas only components 40 with solder bumps on their lower surfaces have been discussed above, it should be understood that in an alternative embodiment of this invention, leaded components having leads extended from their upper surface, e.g., beam leaded components, may be picked up, oriented, centered and placed on substrates with only slight cut-out modification to the feet 306, and minor adjustment of the spacing of the fingers 326 of the centering device as suits the component 40. Connection of the leads to the circuit by conventional means would follow after unloading of the substrate.

In further alternative embodiments of this invention, it should be understood that fluxing and unloading may be manually accomplished rather than automatically as described above.

Also, the order of the steps of traversing, orienting and centering after pickup of a chip 40 may be altered. In the embodiment described above, the chip 40 on the spindle 48 was orientable in discrete increments by 90, 180 or 270 degrees by action of the stepper motor 218. In an alternative embodiment of this invention, a servo motor under computer control may be used to orient the spindle 48 to any desired angular position. In such an embodiment, the chip 40 on the spindle tip 266 is first centered and then angularly oriented prior to placement on the substrate 30.

In yet another alternative embodiment of this invention, permanent soldering of the chip 40 to the substrate 30 may be accomplished at the time of chip placement by the spindle 48 using, for example, known thermal or sonic soldering techniques.

We claim:

1. A hybird circuit board assembly apparatus for placement of component chips on a substrate comprising:

a first head assembly including a first spindle movable vertically up and down, said spindle being capable of attaching to and holding one of said component chips;

traversing means for translating said first head assembly in X and Y directions with said first spindle;

nesting means for holding said substrate in a fixed position for population within the range of translation of said first head assembly and said spindle;

storage means for holding said component chips prior to attachment to said first spindle, said storage means located within the range of translation of said head assembly and said spindle;

means for vertically moving said first spindle up and down, whereby said spindle may traverse to any position over said storage means and attach to any of said component chips stored therein, and said spindle with said attached component chip may traverse to any position over a substrate held in said nesting means at said position for population and deposit said component chip on said substrate;

a second head including a second spindle and second traversing means for translating said second head assembly, said head assembly and second spindle being translatable to said nesting means at said position for population and to said storage means;

control means whereby the X and Y positions of said first and second head assemblies are directed and monitored whereby said spindles are caused to operate alternately to deposit said component chip on said substrate at said position for population.

2. The assembly apparatus of claim 1 further comprising means to rotate said spindle about its longitudinal axis whereby a component attached to said spindle is angularly oriented.

3. The assembly apparatus of claim 2 wherein said means to rotate said spindle include a stepper motor connected to said spindle.

4. The assembly apparatus of claim 1 further comprising means to center on said spindle a component chip carried on said spindle.

5. The assembly apparatus of claim 1 further comprising:

means for fluxing the upper surface of said substrate held in said nesting means;

means for unloading said substrate from said nesting means; and means for transporting said substrate held in said nesting means in sequence from the load station wherein said substrate is inserted in said nesting means, to said fluxing means, to said position for population, and to said unloading means.

6. The assembly apparatus of claim 5 wherein said storage means includes a plurality of storage trays, said trays being in predetermined positions within said storage means, said trays comprised of a plurality of open compartments in an ordered pattern, each of said compartments suited to store one of said component chips.

7. The assembly apparatus of claim 6 further comprising means to center on said spindle a component chip carried on said spindle, and wherein the dimensions of said open compartments and the dimensions of said component chips stored individually in said compartments are unequal whereby said stored component chip is not precisely constrained in said compartment.

8. The assembly apparatus of claim 7 wherein said head assembly includes means connected to said spindle to center said component chip on said spindle, said means to center traversing with said head assembly and spindle.

9. The assembly apparatus of claim 7 wherein said head assembly includes means to rotate said spindle about its longitudinal axis, whereby a component attached to said spindle is angularly oriented, the degree of orientation being directed by said control means.

10. The assembly apparatus of claim 9 wherein all operations after loading of said substrate into said nesting means are automatically controlled.

11. The assembly apparatus of claim 5 wherein the means for fluxing said substrate comprises a stamp pad wet with flux, said stamp pad including:
a planar base;
individual lands of resilient material raised above said base, said lands arranged in separated rows and columns, said lands in alternate rows being raised a lesser distance above said base than the lands in intermediate rows, all of said lands in said alternate rows having coplanar wetted surfaces, all of said lands in said intermediate rows having coplanar wetted surfaces, whereby said substrate is fluxed by pressing said wetted pad against said substrate and said alternate rows of said lands disengage first from said substrate when said pad and said substrate are separated.

12. The assembly apparatus of claim 5 wherein said fluxing means includes:
a mat wetted with flux;
a resilient stamp pad attached to a pivotable arm, said arm in one position locating said stamp pad over said mat, said arm in a second position locating said stamp pad over said substrate, said substrate held in said nesting means at said fluxing means;
means to raise, lower and pivot said arm, whereby said stamp pad is lowered to contact said wetted mat, raised and pivoted to said second position and lowered to press against and coat said substrate with flux.

13. The assembly apparatus of claim 5 wherein said nesting means and means for transporting said substrate include:
a circular table, said nesting means attached to said circular table;
reference pins fixedly engaging both said table and said nesting means, said substrate when in said nesting means held against said reference pins cooperating reference means on, said head assembly being held against said reference pins when zeroing said control means;
movable latches, said latches when closed holding said substrate in said nesting means;
means to move said latches; and
means to rotate said table in indexed steps whereby said substrate in said nesting means is transported in turn to said fluxing means, to said position for population, and to said means for unloading.

14. The assembly apparatus of claim 5 wherein said traversing means comprises:
a first platform capable of moving in the X direction;
a second platform capable of moving in the Y direction said second platform mounted on said first platform, said head assembly mounted on said second platform;
first lead screws driving said first platform, said lead screws rotated by a first servo motor;
second lead screws driving said second platform, said lead screws rotated by a second servo motor;
individual encoders connected one to each servo motor, said encoders outputting signals to said control means indicative of spindle X-Y position.

15. The assembly apparatus of claim 1 wherein a pneumatically operated dashpot-type piston and cylinder connects to said spindle whereby said vertical movability is provided.

16. The assembly apparatus of claim 15 wherein the pneumatic pressure applied to said piston and cylinder is variable whereby the downward force exerted by said spindle in depositing a component held by said spindle on said substrate is variable.

17. The assembly apparatus of claim 1 wherein said spindle has a hollow tip and a vacuum provided within said hollow tip causes a component chip contacted by said spindle to become attached and carried therewith.

18. The assembly apparatus of claim 17 wherein a positive pressure is provided within said hollow tip whereby said component chip attached to said spindle is separated from said spindle.

19. The assembly apparatus of claim 17 wherein a restricted fitting separates said hollow tip from the source of said vacuum whereby the presence is readily detected of said component chip attached to said spindle.

* * * * *